United States Patent [19]

Bauer et al.

[11] 4,419,639

[45] Dec. 6, 1983

[54] KEY ASSEMBLY

[75] Inventors: Karl-Heinz Bauer; Gerold Eckert, both of Bad Neustadt; Wolfgang Labude, Constance, all of Fed. Rep. of Germany

[73] Assignee: Preh Elektrofeinmechanische Werke Jakob Preh Nachf. GmbH & Co., Bad Neustadt, Fed. Rep. of Germany

[21] Appl. No.: 301,659

[22] Filed: Sep. 14, 1981

[30] Foreign Application Priority Data

Oct. 18, 1980 [DE] Fed. Rep. of Germany ....... 3039401

[51] Int. Cl.$^3$ .......................... H03J 1/06; H03J 7/02
[52] U.S. Cl. ......................................... 334/7; 334/89; 358/195.1; 455/173; 455/175
[58] Field of Search ............... 334/7, 15, 89; 455/173, 455/175; 358/195.1

[56] References Cited

U.S. PATENT DOCUMENTS 3,721,926 3/1973 Berenbaum et al. .................... 334/7
3,968,464 7/1976 Okada et al. ...................... 334/89 X

FOREIGN PATENT DOCUMENTS 2833184 2/1980 Fed. Rep. of Germany .

Primary Examiner—Paul L. Gensler

Attorney, Agent, or Firm—Woodcock, Washburn, Kurtz, Mackiewicz & Norris

[57] ABSTRACT

A key assembly for receiving units employed in communications engineering, particularly for television receivers, comprises a plurality of mutually releasable depressible keys adapted to switch on storable, selectively adjustable electrical values supplied by channel memories consisting of a plurality of voltage dividers for capacitance diode tuning, further comprising, in association with the respective depressible keys, a plurality of depressible and rotatable knobs adapted to be rotated by means of a tool, said knobs being concealed behind a cover member slidably guided in a recess, said knobs being adapted to provide channel tuning and, if required, selection of the desired frequency range, said frequency range being adjustable by rotating the respective depressible and rotatable knob into any of a plurality of detented angular positions with the knob being in a position differing from the tuning position of the knob, and comprising a switch which is adapted to be actuated by means of a push rod which is capable of being operated through the medium of said cover member. Said switch actuating push rod (19) in addition constitutes said tool permitting said depressible and rotatable knobs (5) to be rotated.

13 Claims, 8 Drawing Figures

KEY ASSEMBLY

BACKGROUND OF THE INVENTION

The invention relates to key assembly apparatus for communicating receiving units such as television receivers, and in particular apparatus having a plurality of knobs adapted to be rotated by means of a tool for providing channel tuning.

BRIEF DESCRIPTION OF THE PRIOR ART

Key assemblies for television and other types of communication receivers are employed in various forms preferably for tuning and switching-on high-frequency receivers such as radio or television receivers. By pressing a single key it is possible to select a preset tuning voltage and thus to select the broadcasting station or transmitter associated therewith or the respective channel. Storage of the tuning voltage adjusted is effected in channel memories comprising spindle-type resistors connected to act as voltage dividers. The channel memories and their indicating means as well as perhaps the adjusting means provided for frequency range preselection need not and should not be directly accessible during normal operation of the unit so as to prevent incidental or inadvertent maloperation. Besides, too large a number of knobs or buttons capable of being both pressed and rotated may detract from the pleasing appearance of the unit. Therefore, the practice has been adopted of accommodating the adjusting means in recesses provided in the casing and to provide closure means for these recesses in the form of folding doors or flaps. Moreover, there has been the tendency of providing the largest possible number of depressible and rotatable buttons or knobs. On the other hand, however, only a restricted space for accommodating such controls is available in most cases on the front panel of a television receiver. This situation had led to a constant decrease in the spacing of said depressible and rotatable controls. However, the lateral spacing of these controls cannot be reduced indefinitely in view of the fact that manual rotation of the controls which are also employed for tuning purposes should also be possible with the controls being in their depressed position. In order to make it nevertheless possible to reduce said lateral spacing, auxiliary means in the form of a socket wrench have been adopted.

In published German Patent Specification No. DE-OS 28 33 184 there has already been disclosed a key assembly which is provided with such a socket wrench. This wrench is a single-piece member made of a plastic material, and it is secured to the inner surface of a folding door with the aid of retaining means. One end of the socket wrench has a cross-shaped profile, whereas the other end, which has a knurled or serrated circumferential surface to facilitate manual rotation thereof, is of slightly larger diameter. With the folding door closed, the socket wrench, together with its retaining means, is accommodated in a recess which extends over the adjusting members provided for frequency range preselection. In addition, there may be provided an AFC switch which is adapted to be actuated simultaneously with said folding door. Two detented positions are provided for this switch. Closing the folding door causes the AFC switch to be activated. However, with the folding door open, the AFC switch will first have to be deactivated manually to permit channel adjustment. On the other hand, key assemblies are available in which the AFC switch is constructed as a key so that opening the folding door will automatically cause the AFC switch to be deactivated. Since the housing of the AFC switch is disposed on the rear side of the frame housing, the distance between the housing of the AFC switch and the folding door is bridged by means of a push rod which is rigidly attached to the contact slide of the AFC switch.

OBJECT OF THE INVENTION

It is an object of this invention to provide a key assembly for television type receivers in which the employment of one of the known components is dispensed with, this resulting in a decrease in manufacturing costs, which affords easier and more accurate adjustment of the tuning voltage and which ensures dependable deactivation of the AFC switch.

SUMMARY OF THE INVENTION

According to the invention, the above object is attained by the provision of an AFC switch actuating push rod which can be removed and operated as a tool for channel tuning. When in its normal position, the switch rod maintains the AFC in the ON state, and when removed the AFC switch automatically goes to the OFF state. Further advantageous embodiments of the invention are set forth in the claims hereto. The use of a socket wrench can be dispensed with because the switch operating push rod is simultaneously employed as a means permitting the depressible and rotatable knobs to be rotated. In addition to the fact that this arrangement results in a saving of material, it requires the push rod to be removed to permit the knob to be rotated, the result being that, during a tuning operation, assurance is given that the AFC switch is deactivated. Thus, dependable adjustment of the tuning voltage is ensured even if the arrangement is operated by an unskilled person who is not aware of the relation between the AFC switch and the tuning means. Another advantage resides in the fact that the operating head section has a considerably larger diameter than the known socket wrenches, this ensuring easier and more accurate adjustment of the tuning voltage. In view of the restricted space available, it would be impossible to accommodate a socket wrench having the same diameter on the folding door or in the recess which is covered by a ribbon resembling a Venetian blind.

BRIEF DESCRIPTION OF THE DRAWINGS

The invention and further particulars will be described more specifically hereinafter with reference to a preferred embodiment shown in the drawings, in which.

DETAILED DESCRIPTION OF THE PREFERRED EMBODIMENTS OF THE INVENTION

Figure 1:
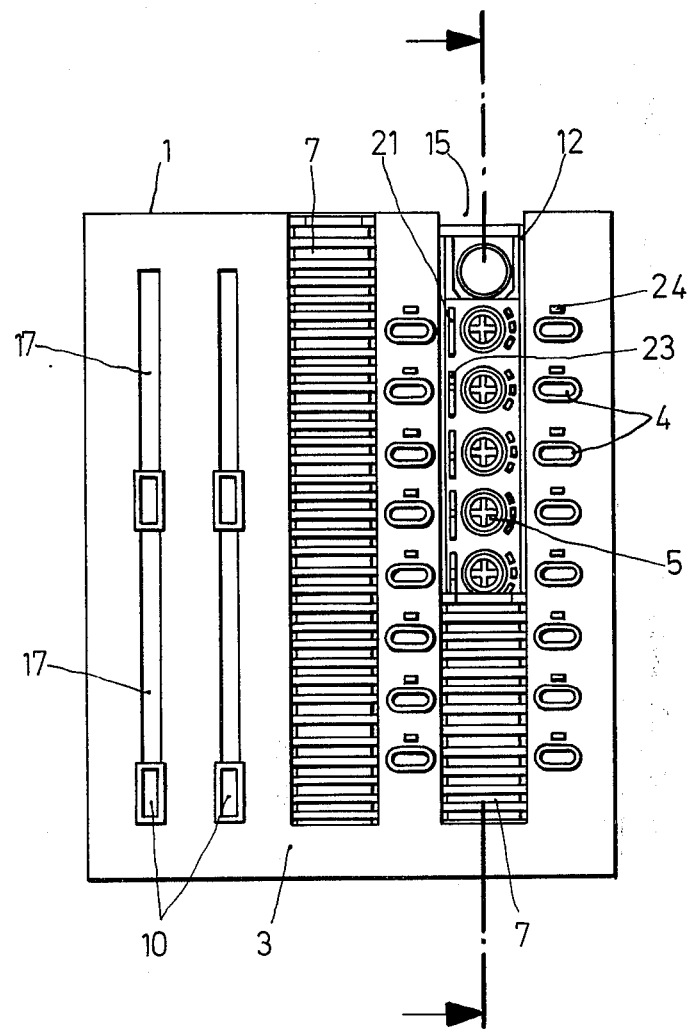
FIG. 1 shows the front elevation of a key assembly according to the invention.
Figure 2:
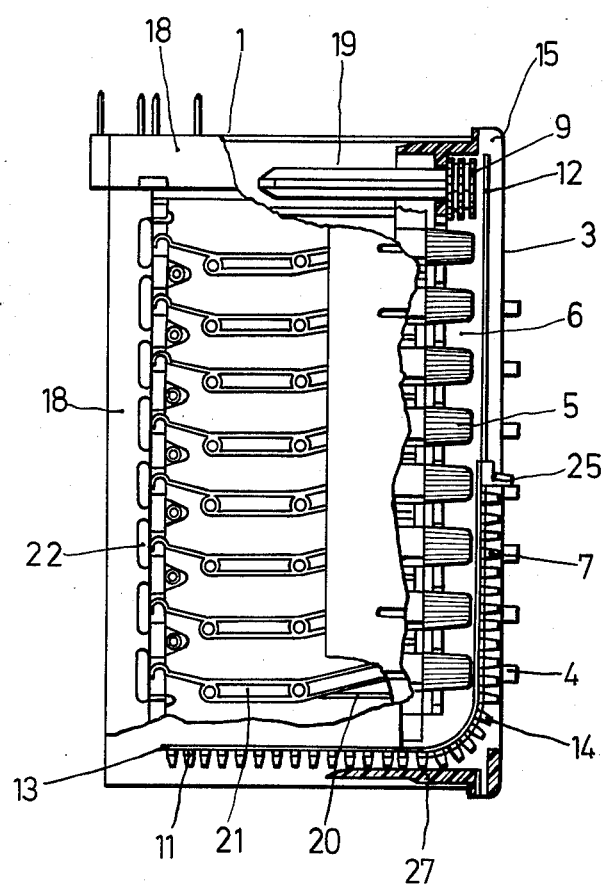
FIG. 2 shows a partially sectioned side elevation of the key assembly of FIG. 1.

The key assembly shown in FIG. 1 and generally designated by reference numeral 1 comprises two rows of eight keys 4 each adapted to switch on the tuning voltages preset in the individual channel memories, said keys being capable of being released in relation to one another by means of a locking rail. It will be understood that it would, of course, be possible to provide a smaller or larger number of keys. The key assembly proper comprises a casing including a memory housing 18 shown in FIG. 2 provided with a front panel 3 with the adjusting, switching and indicating means being integrated into a structural unit.

In the embodiment shown in FIG. 1 the various controls serving to adjust volume, picture brightness, contrast, etc. are in the form of a plurality of slide resistors 17 disposed alongside the rows of keys 4. It is also possible to employ rotary potentiometers in the place of said sliding resistors. It is a matter of course that it is possible, regardless of whether sliding or rotary resistors are employed, to arrange the adjusting members above or below the rows of keys.

The sliding resistors employed in the present case are constituted in a known manner by a resistance element and a collector track. These two elements are bridged electrically by a metallic sliding contact spring which is attached to a spring carrier. Said spring carrier may be slidably guided in a resistor housing which is, in turn, secured to the front panel of the casing. This arrangement affords the advantage that it is also possible to employ a separate resistor housing forming a structural unit. Said spring carrier is provided with a projection which extends through a slot provided in front panel 3, the free end of each projection being formed with flexible tongues onto which operating button 10 is snapped.

If necessary an additional mains switch may be mounted in the front panel of the casing. This mains switch is conveniently also provided with a housing of its own so that it may be installed as a separate structural unit. As shown in FIG. 2, the memory housing 18 proper is disposed behind the keys 4. This housing contains the rotary resistors forming the channel memories. Each rotary resistor comprises a spindle along which a spring carrier is guided, the spring carrier having attached thereto a sliding spring adapted to establish an electrical connection between the resistor and the spindle. The desired tuning voltage is adjusted by suitably positioning the spring carrier. The individual resistors are disposed side by side on a plate made of insulating material, said plate being retained in the memory housing. One end of each spindle is provided with a depressible and rotatable button 5 which extends into the recess 6 of front panel 3 and which has a circumferential surface which is knurled or serrated or otherwise shaped to permit manual operation without any additional tool. In addition each depressible and rotatable button 5 is provided with an axial recess having a predetermined internal profile.

The spring carrier of each spindle resistor is integrally formed with a pin section which, according to FIG. 2, extends through an elongated recess 20 provided in memory housing 18 and through an elongated hole (not shown) of an indicating member. This elongated hole extends the length of the entire tuning range. Each indicating member is formed by a deflectable indicating tongue 21 provided with said elongated hole within the range of adjustment, said indicating tongues being integrally formed at one end thereof with a mounting rail 22. This mounting rail is provided in common for all indicating tongues and is retained in memory housing 18 by spring action. The other end extends at an angle, this angular section being visible in a window 23 provided in recess 6 of the casing front panel. Each elongated hole is provided with a slight curvature so that the indicating tongues are deflected depending on the position of the spring carrier. This arrangement facilitates indication of the position of the spring carrier and thus indication of the tuning voltage adjusted.

In order to improve the visibility of the keys from a distance, it is possible to provide the key assembly with an additional luminous indicating device which may include, for example, a plurality of light guides forming a star-like array surrounding a source of light, said light guides extending to the individual keys associated therewith, and the ends of the light guides being visible behind windows 24 with which the front panel of the casing is provided as shown in FIG. 1. The source of light includes a socket made of a transparent plastic material having a cavity in which a light bulb is housed. The ends of the light guides extending to the keys are provided with light beam interrrupting means, the arrangement being such that, with a key in its undepressed position, the light beam is interrupted so that the end positioned behind the respective window will remain dark.

In order to prevent immediate access to the adjusting and indicating means during normal operation of the unit, such means are housed in a recess 6 of front panel 3. This recess is concealed by a cover member which is intended to avoid incidental or inadvertent maloperation of the unit. The cover member may be constructed as a rigid sliding member or as a folding door or flap. In the embodiment shown in the drawings, the cover member is constituted by a flexible ribbon 7 resembling a Venetian blind which is guided in the front panel in the manner shown in FIG. 2 so as to follow a curved path upon being slidably moved in its longitudinal direction.

To permit operation of the cover member, it is provided with actuating means 25 as shown in FIG. 2. The front panel is provided with an aperture 15 (FIG. 2) permitting the cover member to be inserted. The ribbon is guided in the front panel by groove and tongue means. These means include guide rails or tongues 12 extending on both sides along the recess.

As shown in FIG. 2, the flexible ribbon 7 resembling a Venetian blind comprises an elongated base member having integrally formed therewith a plurality of ribs 14 extending at right angles to the sliding direction of the ribbon. The height of ribs 14 is such that their outwardly directed surfaces are in alignment with the outer surface of front panel 3. This ensures a pleasing appearance of the unit. At their ends said ribs 14 are provided with recesses 11 adapted to be engaged by the associated tongues 12 of the front panel so that the ribbon is practically provided with groove and tongue guiding means. As shown in the lower part of FIG. 2, each tongue 12 comprises a curved section which extends away from the front panel at the end which is remote from aperture 15. In addition, the bottom of the casing front panel is provided with an integrally formed wall portion 27. As ribbon 7 is slid in a downward direction, it is deflected by the curved portion and thereafter guided between wall portion 27 and the memory housing. Thus, the curved portion constitutes a ribbon deflecting means. In order to facilitate insertion of the ribbon into such guide means, the entry portion of the curved portion is slightly rounded and pointed.

As described above, each depressible and rotatable knob 5 is provided with a recess having a cross-shaped internal profile for receiving a socket wrench or like tool. When turning is to be effected, a socket wrench is inserted into the said knob recess by the operator for rotating the knob. The socket wrench of this invention is the push rod 19, as seen in FIG. 2, the position of which controls the ON-OFF state of the AFC switch, as discussed further below. This push rod may also be used by the operator to select the desired frequency range. To obtain this function, the operator depresses the respective depressible and rotatable knob 5 and then rotates it into the desired operative position.

Figure 3:
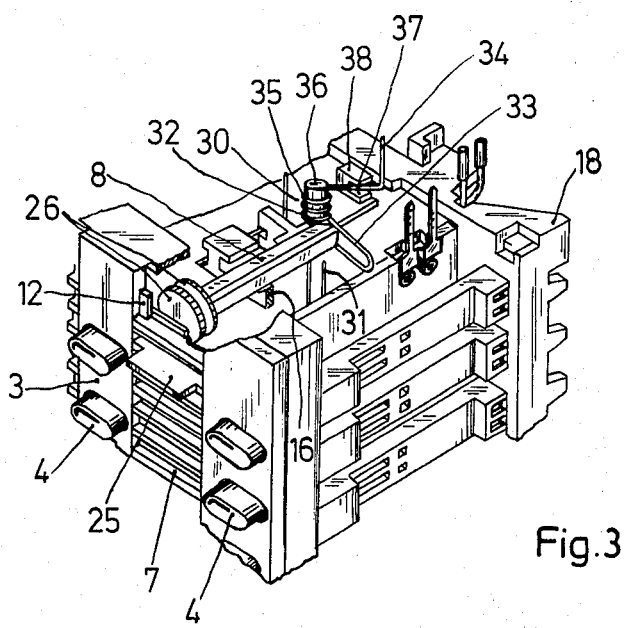
FIG. 3 shows a perspective oblique view of the key assembly with the AFC switch in its ON position.
Figure 4:
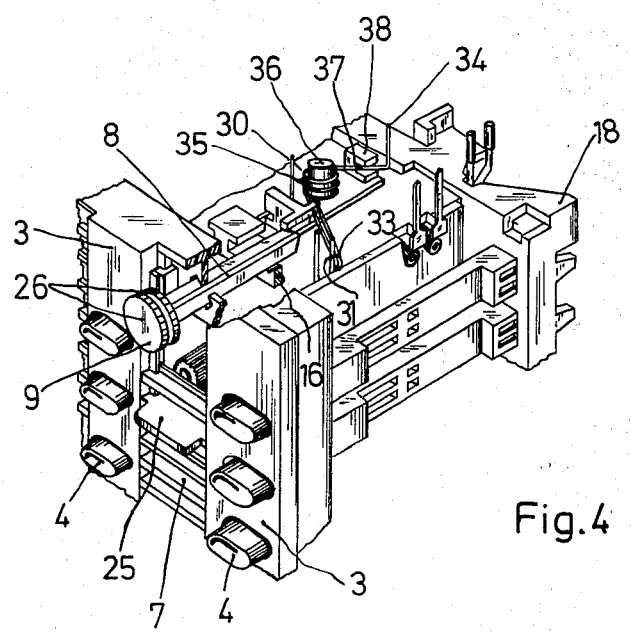
FIG. 4 shows a perspective oblique view of the key assembly with the AFC switch in its OFF position.
Figure 5:
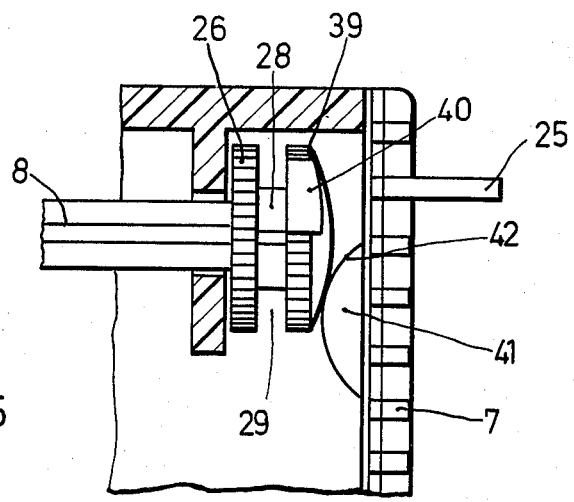
FIG. 5 shows an enlarged portion of a sectional view of the key assembly with the push rod member for the AFC switch in its ON position.
Figure 6:
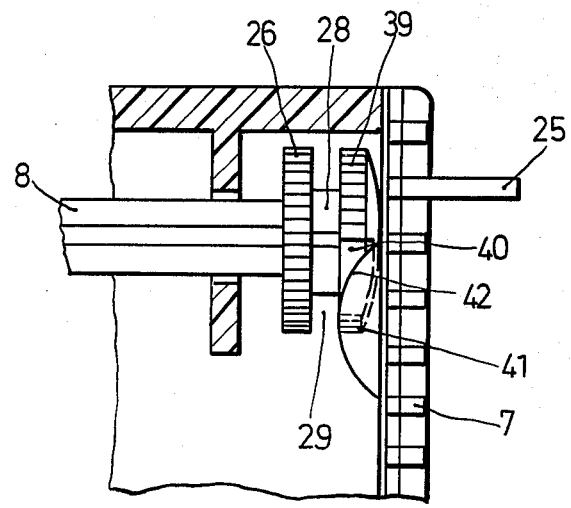
FIG. 6 shows an enlarged portion of a sectional view of the key assembly with a switch operating member after having been rotated through 180 degrees before having been inserted.
Figure 7:
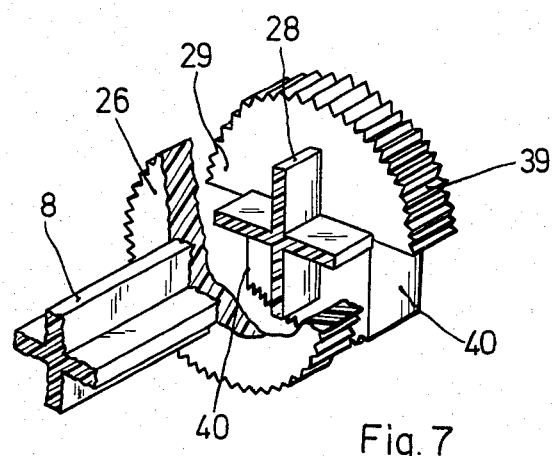
FIG. 7 is a perspective view, partially broken away, showing details of the switch operating member on an enlarged scale.

As may be seen from FIGS. 3 and 4, the switch operating push rod 19, which is made of a plastic material, comprises the push rod 8 proper and an actuating head 9 integrally formed therewith. The diameter of the actuating head is considerably larger than the diameter of the push rod portion 8 so that easy rotation of the depressible and rotatable knob is obtained. For the purpose of guiding the push rod having a cross-shaped cross section in the key assembly, said memory housing 18 is provided with a guiding groove 16 which also has a cross-shaped cross section. The circumferential surface of the actuating head 9 is knurled or serrated or otherwise shaped to permit it to be firmly grasped by the fingers of the user. In conjunction with the relatively large diameter of the actuating head, this shape ensures accurate fine adjustment of the tuning voltage. As shown in FIGS. 5 and 6, the actuating head comprises at least two disk portions 26, 39 which are interconnected by a section 28 of smaller diameter. As a result, there exists an annular groove 29 facilitating pulling-out of push rod 19 from the casing by the user who engages his finger nails in this groove. The embodiment of a push rod shown in the drawings is provided with two disk-shaped portions, it being, however, understood that more than two such portions might be provided. The outermost disk-shaped portion 39 has a crowned end face so as to facilitate sliding of the key cover ribbon over the push rod and thus to facilitate insertion of the push rod into the casing when it is desired to actuate the AFC switch 30.

As shown in FIGS. 3 and 4, the AFC switch 30 comprises a first stationary contact piece 31 made of wire. It further comprises a second contact piece 32 also made of wire material and including two arms, one arm being constituted by a swingable contact element 33. Contact element 33, besides functioning as a contact, serves, as the cover ribbon resembling a Venetion blind is moved in its longitudinal direction, to force the switch operating push rod out of the casing to such an extent that the user can conveniently engage a finger nail in the angular groove 29 (FIG. 5) so that he may completely withdraw the push rod in order to use it as a wrench or tool for operating a tuning switch, i.e., by rotating a knob 5. The other arm of contact piece 32 is constituted by the stationary terminal portion 34 seen in FIGS. 3 and 4. The two arms of second contact piece 32 form a plurality of interconnected turns 35 surrounding a peg 36 provided in the casing, said peg constituting a kind of abutment for the second contact piece. Besides, the stationary terminal portion 34 is retained by a slot 37 provided in a retaining portion 38 integrally formed with the casing. FIG. 3 shows the AFC switch in its ON position, whereas FIG. 4 shows the OFF position. Whenever it is intended to readjust the tuning voltage by means of the switch operating push rod, the AFC switch is deactivated by the withdrawal of the push rod due to the contact of elements 31 and 33 as shown in FIG. 4. Thus, in the illustrated embodiment the AFC switch is short circuited when elements 31 and 33 are in contact with each other. As long, however, as the cover ribbon resembling a Venetian blind is closed, the AFC switch is closed to provide automatic frequency control.

Assuming that the key assembly comprises two memory housings with two rows of depressible and rotatable knobs and that it is intended to effect tuning in that row in which no AFC switch is present, and further assuming that the switch operating push rod is to be employed as a tool for rotating the knobs, it is necessary to move the cover ribbon of the other row of knobs until it is possible to withdraw the push rod and thus to move the AFC switch into its OFF position.

Figure 8:
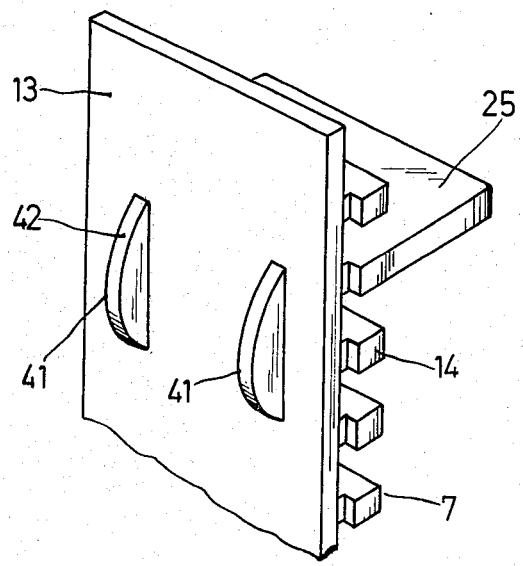
FIG. 8 is a perspective view of the switch operating member and part of the ribbon resembling a Venetian blind.

Another embodiment of the switch actuating push rod is shown in FIGS. 5 to 8. At least the outermost disk-shaped portion 39 of the push rod is provided, within a semicircular portion thereof, with two cutouts 40 facing away from one another. These cutouts are formed as V-shaped segments, each comprising a right angle. Said cutouts are arranged in such a manner that they form two edge surfaces extending parallel to one another. Said cutouts are adapted to cooperate with projections 41 provided on the inner surface of cover ribbon base 13 (FIG. 8). With the push rod inserted into the housing in the manner shown in FIG. 6, that is to say that the two cutouts open in a downward direction, i.e. towards the row of depressible and rotatable knobs, the projections 41 are in engagement with the cutouts so that the AFC switch is in its OFF position although the flexible ribbon has been slid into its uppermost position. If it is intended to place the AFC switch into its ON position, it is only necessary to rotate the push rod through 180 degrees about its axis and to insert it into the housing in this position. Upon the flexible ribbon being slid in an upward direction, the inclined portions 42 of projections 41 will come into engagement with the crowned outer surface of the disk-shaped portion 39 of the push rod, thus pushing the rod in a rearward direction as shown in FIG. 5 in order to place the AFC switch into its ON position. Thus, the second embodiment of the switch actuating push rod just described makes it possible, with the flexible cover ribbon in its closed position, to select any of the possible positions of the AFC switch.

Not shown in the drawings is still another embodiment in which the recess of the casing is covered by a folding door or flap. If it is desired to provide the possibility of selecting the desired position of the AFC switch, said flap may be provided with one or two projections which, depending on the position of the push rod, cooperate with one or a plurality of cutouts or with the outermost disk-shaped portion of the push rod.

What is claimed is:

1. A key assembly for a receiving unit having a plurality of communications channels, comprising a casing with a recess for receiving a cover member, a plurality of mutually releasable depressible keys adapted to switch on storable, selectively adjustable electrical values supplied by channel memories, further comprising in association with said keys a plurality of depressible and rotatable knobs adapted to be rotated by means of a tool, a slidable cover member positioned in said recess and normally covering said knobs to conceal them, said knobs being adapted to provide channel tuning, and further comprising:

a switch for controlling an operating function of said unit, a removable push rod and mounting means for mounting said push rod so that it is normally held by said cover member in a position wherein it holds said switch in an ON condition, said switch having means to move said push rod in a direction out of said casing and to switch to an OFF condition when said cover member is moved from holding said push rod, and wherein said push rod also consitutes said tool.

2. The key assembly of claim 1, characterized in that said push rod (19) comprises an operating rod portion (8) and an actuating head portion (9) integrally formed therewith, the diameter of said actuating head being larger that of said operating rod portion.

3. The key assembly of claim 2, characterized in that said operating rod portion (8) has a cross-shaped cross section and that said mounting means comprises a cross-shaped guiding groove (16) adapted to receive the axially slidable operating rod portion.

4. The key assembly of claim 2, characterized in that said actuating head (9) of said switch actuating push rod (19) has a circumferential surface which is knurled, serrated or otherwise shaped to ensure a reliable gripping by the fingers of the user.

5. The key assembly of claim 1, wherein said switch is an AFC switch, whereby removal of said push rod for channel tuning automatically accomplishes deactivation of the unit AFC.

6. A key assembly as claimed in claim 2, wherein said actuating head portion (2) comprises a disk-shaped portion (39) having, in one semicircular part thereof, two cutouts (40) facing away from one another, said cover member having two projections (41) integrally formed on its inner surface, each of said cutouts being adapted to be engaged by a respective projection (41) when said actuating push rod (19) has been inserted into said mounting means.

7. The key assembly of claim 6, characterized in that said cutouts (40) are in the form of V-shaped segments having a right angle, and that said cutouts include two surfaces extending parallel to one another.

8. A key assembly as claimed in any of the preceding claims 1 to 4, characterized in that said cover member is in the form of a ribbon (7) resembling a Venetian blind and slidably guided within the key assembly.

9. A key assembly as claimed in any of the preceding claims 1 to 4, characterized in that said cover member is in the form of a pivotable door or flap.

10. A key assembly as claimed in any of the preceding claims 1 to 4, characterized in that said switch comprises a first stationary contact piece (31) and a two-armed second contact piece (32), one arm of said second contact piece being constructed as a swingable contact element (33) capable of being operated by the switch actuating push rod, the other arm of said second contact piece being constructed as a stationary contact piece (34).

11. The key assembly of claim 10, characterized in that said first contact piece (31) and said second contact piece (32) are made of wire material, and comprising abutment means for supporting said second contact piece constituted by a peg (36) integrally formed with said key assembly, said second contact piece having a plurality of turns (35) surrounding said peg.

12. A key assembly as claimed in any of the preceding claims 2 to 4, characterized in that said actuating head (9) comprises at least two parallel disk portions (26) with any two adjacent portions being interconnected by a connecting portion (28) of smaller diameter, the disk portions and the connecting portions thus defining annular grooves (29).

13. Key assembly apparatus for use with a communications receiving unit having a plurality of communications channels, comprising a plurality of tuning means for tuning respective ones of said channels, said tuning means being adapted to receive a manually operated tool for said tuning, an ON-OFF AFC switch for controlling the AFC function of said communications unit, said switch having bias means for normally holding itself in its OFF state, a casing within which said assembly is housed, said casing having a recess and a slidable cover member positioned in said recess for normally covering said tuning means, tool means for tuning said tuning means, mounting means for mounting said tool means within said casing and below said cover member, and positioned so that one end thereof abuts said switching means so as to hold it in an ON state and so that the opposite end thereof is restrained by said cover member when said member is closed above said tool, whereby when said cover member is opened said AFC switch deactivates itself and said biasing means moves said tool so that it can be withdrawn by an operator and used for tuning.

* * * * *